(12) United States Patent
Kononchuk et al.

(10) Patent No.: US 6,346,460 B1
(45) Date of Patent: *Feb. 12, 2002

(54) LOW COST SILICON SUBSTRATE WITH IMPURITY GETTERING AND LATCH UP PROTECTION AND METHOD OF MANUFACTURE

(75) Inventors: Oleg V. Kononchuk; Sergei Koveshnikov, both of Vancouver, WA (US)

(73) Assignee: SEH-America, Vancouver, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/281,729

(22) Filed: Mar. 30, 1999

(51) Int. Cl.[7] .............................................. H01L 21/322
(52) U.S. Cl. ......................... 438/473; 438/524; 257/617
(58) Field of Search ................................ 438/473, 471, 438/527; 257/617

(56) References Cited

U.S. PATENT DOCUMENTS

| | | | |
|---|---|---|---|
| 4,376,657 A | * 3/1983 | Nagasawa et al. | 148/1.5 |
| 4,754,315 A | 6/1988 | Fisher et al. | |
| 5,286,978 A | 2/1994 | Yoshida et al. | |
| 5,362,978 A | 11/1994 | America | |
| 5,464,785 A | 11/1995 | Hong | |
| 5,569,619 A | 10/1996 | Roh | |
| 5,585,283 A | 12/1996 | America | |
| 5,976,956 A | * 11/1999 | Gardner et al. | 438/473 |
| 6,022,793 A | * 2/2000 | Wijaranakula et al. | 438/473 |

OTHER PUBLICATIONS

S. Wolf, R. Tauber. Silicon Processing for the VLSI Era, vol. 1: Process Technology. Lattice Press, California, 1986. pp. 137–139.*

* cited by examiner

Primary Examiner—Olik Chaudhuri
Assistant Examiner—Ginette Peralta
(74) Attorney, Agent, or Firm—Alston & Bird LLP

(57) ABSTRACT

A low cost method of manufacturing a silicon substrate having both impurity gettering and protection against CMOS latch up. The method includes performing a low energy implant of a selected acceptor ion to form a low resistivity buried layer closely adjacent the front surface of a silicon wafer. A low energy silicon implant is also performed to create a plurality of gettering sites closely adjacent the front surface. Subsequently, an epitaxial silicon layer is grown on the front surface.

19 Claims, 4 Drawing Sheets

LOW COST SILICON SUBSTRATE WITH IMPURITY GETTERING AND LATCH UP PROTECTION AND METHOD OF MANUFACTURE

TECHNICAL FIELD

The present invention relates to silicon substrates for CMOS processing, and more particularly to a low cost method of processing silicon wafers to provide substrates with impurity gettering and latch up protection.

BACKGROUND OF THE INVENTION

Silicon complimentary metal-oxide-semiconductor (CMOS) circuits are well known for their reliability and low power consumption. However, the process for manufacturing CMOS circuits is extremely complex, involving many chemical and mechanical process steps. Fortunately, the process is well suited to automation and mass production, allowing manufacturers to produce thousands of CMOS circuits for only a few dollars each. As a result, CMOS circuits are used in a wide variety of electronic devices including computers, watches, automobiles, telephones, cameras, etc.

Regardless of what electronic devices their circuits are used in, two persistent problems that many CMOS circuit manufacturers contend with are latch up and impurity contamination. As is well known in the art, latch up occurs when parasitic bipolar transistors, which are inherent in the structure of CMOS circuits, begin to conduct current in a positive feed-back loop, causing a short between the power supply and ground. When latch up occurs, the circuit malfunctions and may be permanently damaged.

The most common method of protecting against latch up is to manufacture the CMOS circuits on a silicon wafer that is highly doped with boron (referred to hereinafter as a $p^+$ substrate). A lightly doped epitaxial silicon layer ($p^{31}$ epi layer) is then grown on the front surface of the $p^+$ substrate. The CMOS circuits are fabricated in the $p^-$ epi layer while the $p^+$ substrate acts as "buried layer" beneath the circuits. This buried layer reduces the gain of the parasitic transistors. With reduced gains, the parasitic transistors are less likely to begin conducting current, and less likely drive each other in the event current does begin to flow.

However, $p^+$ silicon wafers are relatively expensive. In addition, the high concentration of boron in the $p^+$ substrate causes problems during later processing because the boron tends to diffuse out of the back surface of the wafer and deposit on the $p^-$ epi layer, thereby changing the electrical properties of the epi layer. This phenomenon is known as the "autodoping effect." To combat the autodoping effect, manufacturers must employ an additional processing step to deposit silicon dioxide on the back surface of the wafer, which prevents the boron from diffusing out of the $p^+$ substrate. This additional processing step increases the cost of manufacturing.

Impurity contamination of the silicon wafer is a problem throughout the CMOS manufacturing process. However, despite the best efforts of manufacturers, a certain amount of contamination is virtually inevitable. Furthermore, as the size of CMOS circuits continues to shrink, the detrimental effect of even a small amount of contamination is magnified. Fortunately, at least some impurities that reach the silicon wafer can be neutralized through "gettering." Gettering is a natural process by which defects in the crystal lattice attract impurities within the silicon. The impurities are attracted to the defects due to the strain the defects create in the crystal lattice. As a result, impurities tend to precipitate around the defects.

Manufacturers often take advantage of this gettering process by intentionally creating defects, or gettering sites, in the crystal lattice to attract contaminants away from the circuitry. A common way of creating these Bettering sites, known as "intrinsic gettering," is to incorporate oxygen into the silicon during crystal growth. A subsequent heat treatment will cause the oxygen to diffuse away from the surface of the silicon wafers to form silicon dioxide clusters within the crystal structure. These clusters create strain fields in the crystal structure which serve to attract impurities. However, intrinsic gettering requires relatively precise control of the oxygen concentration during crystal growth to achieve the desired gettering effect. Furthermore, the additional heat treatment increases the cost of production.

Alternative gettering methods involve creating strain on the back of the silicon wafer to attract impurities away from the front of the wafer. For example silicon wafer manufacturers often sandblast the back surface of the wafer to damage the crystal lattice and thereby cause strain. Alternatively, a polysilicon layer is sometimes deposited on the back surface of the wafer to create strain within the crystal lattice. This method is known as "polysilicon backseal." However, each of these alternative methods involves additional process steps which increase the cost of production.

Moreover, one disadvantage shared by all of the above gettering methods is relatively low gettering efficiency. Because the gettering sites are formed relatively far away from the epi layer, impurities within or near the epi layer are less likely to be attracted to the sites than if the sites were disposed relatively close to the epi layer.

SUMMARY OF THE INVENTION

The invention provides a low cost method of manufacturing a silicon substrate having both impurity gettering and protection against CMOS latch up. The method includes performing a low energy implant of a selected acceptor ion to form a low resistivity buried layer closely adjacent the front surface of a silicon wafer. A low energy silicon implant is also performed to create a plurality of gettering sites closely adjacent the front surface. Subsequently, an epitaxial silicon layer is grown on the front surface. The buried layer provides protection against latch up for CMOS circuits fabricated in the epitaxial layer. In addition, the plurality of gettering sites attract impurities away from the circuitry.

DETAILED DESCRIPTION AND BEST MODE FOR CARRYING OUT THE INVENTION

Figure 1:
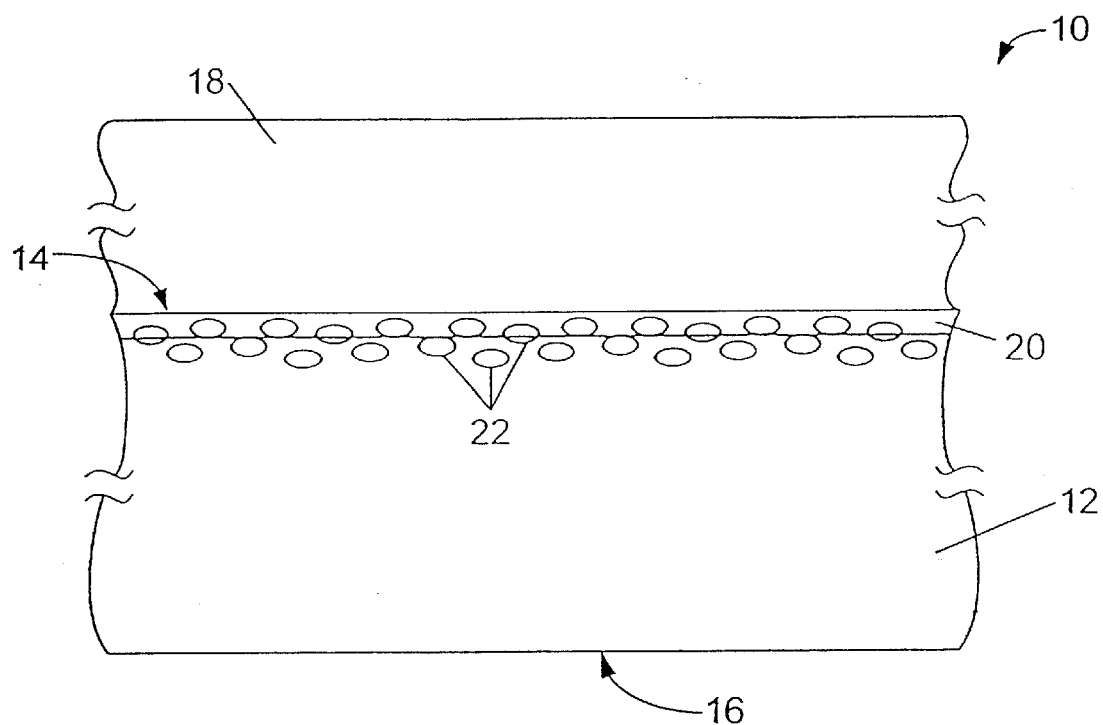
FIG. 1 is a fragmentary, cross-sectional view of a silicon substrate manufactured according to the present invention.

A silicon substrate configured for CMOS processing according to the present invention is shown generally at 10 in FIG. 1. Substrate 10 includes a silicon wafer 12 having a front surface 14 and a back surface 16. An epitaxial silicon layer (epi layer) 18 is grown on front surface 14 to form a region suitable for fabricating CMOS circuitry. Wafer 12 includes a heavily doped region 20 adjacent the front surface to act as a low resistivity buried layer to suppress latch up of CMOS circuits fabricated in epi layer 18. In addition, wafer 12 includes a plurality of gettering sites 22 adjacent front surface 14 to attract impurities away from epi layer 18.

Although the invention is herein described in the context of processing a silicon substrate for CMOS fabrication, it will be appreciated that other electronic circuitry may be fabricated on the substrate instead of, or in addition to, CMOS circuitry. Therefore, it will be understood that references to CMOS circuitry include these other circuitry.

Substrate 10 is typically in the form of a circular disk having a diameter and thickness which conform to prescribed standards within the semiconductor industry. For example, many manufacturers currently use silicon wafers having a diameter of approximately 200 nun and a thickness of approximately 0.725 mm. However, it will be appreciated that substrate 10 may have a different diameter or thickness, or may be in a form other than a circular disk.

Silicon wafer 12 is usually a single crystal structure with front surface 14 being aligned substantially along the primary crystal plane. Front surface 14 is typically highly polished to form a relatively planar surface. Back surface 16, which is substantially parallel to front surface 14, may also be polished, or may be comparatively rough or irregular. In any event, wafer 12 forms a rigid and electrically semiconducting base, which is compatible with standard CMOS processes.

As depicted in FIG. 1, wafer 12 is lightly doped with a selected acceptor dopant so that the wafer is a p-type wafer with a relatively high resistivity ($p^-$ wafer). Typically, the selected acceptor dopant is boron. In addition to acting as a dopant, boron also acts as a gettering site for some impurities. Alternatively, wafer 12 may be a highly doped p-type wafer ($p^+$ wafer). As a further alternative, wafer 12 may be doped with a selected donor dopant so that the wafer is n-type with a relatively high resistivity ($n^-$ wafer), or a relatively low resistivity ($n^+$ wafer). Examples of common donor dopants include phosphorus, arsenic, and antimony.

Epi layer 18 is grown on front surface 14 using any of several standard epitaxy processes, which are well known in the art. Epi layer 18 is a single crystal silicon layer having a crystal orientation identical to wafer 12. Typically, epi layer 18 is approximately 5 $\mu$m (5×10$^{-6}$ meters) thick and lightly doped with boron to form a $p^-$ epi layer having a uniform resistivity. It will be appreciated, however, that these parameters may be varied as required by a particular CMOS process. Thus, epi layer 18 may be either thinner or thicker than 5 $\mu$m. In addition, epi layer 18 may be doped to any desired resistivity using either acceptor or donor dopants.

Figure 2:
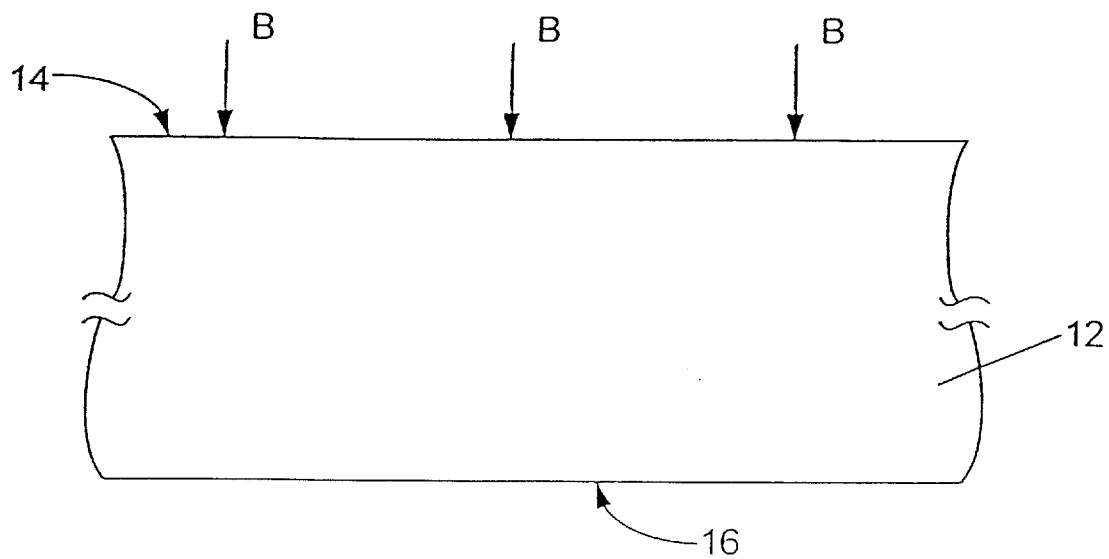
FIG. 2 is a fragmentary, cross-sectional view of a silicon wafer undergoing a low energy boron implant according to the present invention.
Figure 3:
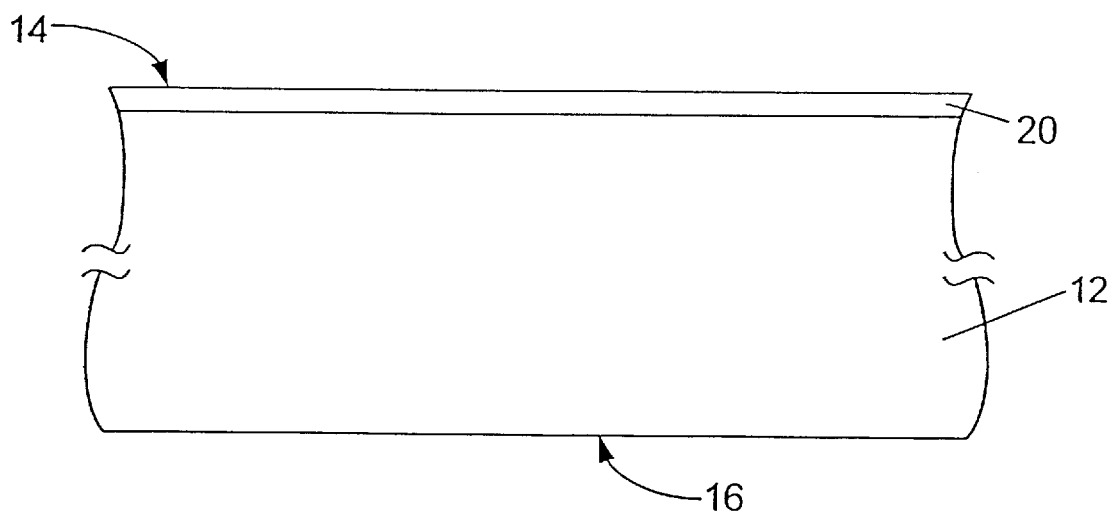
FIG. 3 is a fragmentary, cross-sectional view of the silicon wafer of FIG. 2 after the boron implant is completed, showing the resulting buried layer.

As depicted in FIGS. 2 and 3, heavily doped, low resistivity buried layer 20 (referred to hereinafter as $p^+$ region 20) is formed by low energy ion implantation of a selected acceptor dopant into front surface 14 before epi layer 18 is grown. Typically, the selected acceptor dopant is boron. However, other acceptor dopants are available and within the scope of the invention. The ion energy and dose of the acceptor ion implantation are preferably adjusted to form $p^+$ region 20 closely adjacent front surface 14. In one embodiment, $p^+$ region 20 extends less than approximately 0.5 $\mu$m beneath front surface 14. Typically, $p^+$ region 20 extends approximately 0.1 $\mu$m beneath the front surface.

It will be appreciated that the necessary ion energy will vary depending on a variety of factors including the crystal orientation of wafer 12, the particular dopant chosen, the angle of implantation, etc. Generally, the ion energy is within the range of approximately 5–200 keV; however, other ion energies may be required depending on the application.

Similarly, the dose will also vary depending on several factors including the ion energy used and the background doping concentration of wafer 12. Generally, the dose is in the range of approximately $10^{13}$–$10^{16}$ cm$^{-2}$; however, other doses may be required depending on the application. Typically, the dose is adjusted so that $p^+$ region 20 has a resistivity of approximately 0.1 ohm-cm or less. In one embodiment, a subsequent annealing step is performed to activate the acceptor ions. In an alternative embodiment, the implanted acceptor ions are activated during growth of epi layer 18, which is typically carried out at a temperature in the range of approximately 1050–1200 degrees Celsius.

In any event, $p^+$ region 20 acts as a buried layer to reduce the gain of parasitic transistors in the CMOS circuitry. Thus, the prior art method of preventing latch up (i.e., using a $p^+$ wafer) is unnecessary. Furthermore, wafer 12 may be either n-type or p-type, and may be either lightly or heavily doped since $p^+$ region 20 may be formed in wafer 12 regardless of its type or resistivity by simply adjusting the parameters of the acceptor ion implantation.

Figure 4:
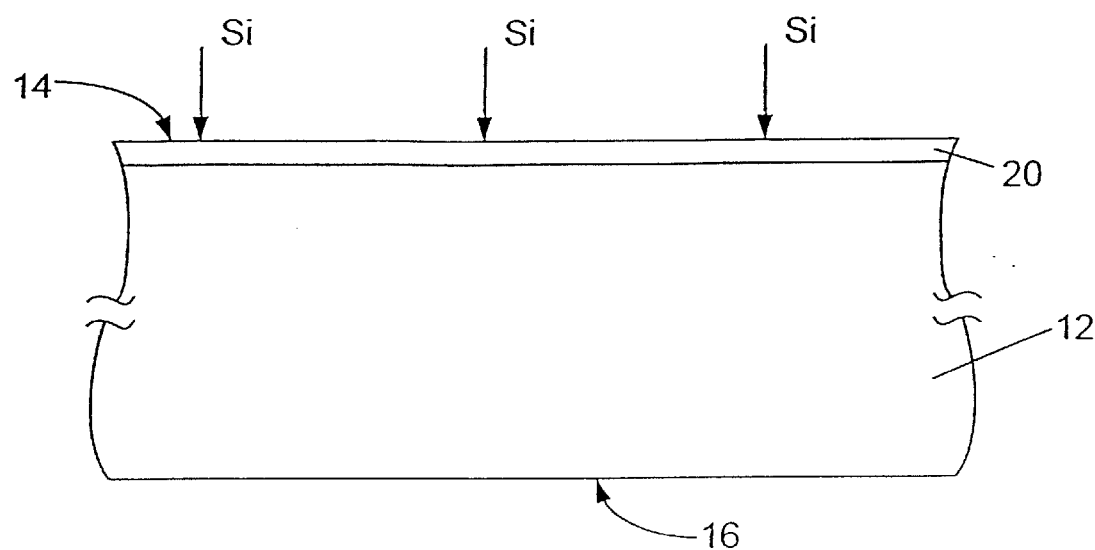
FIG. 4 is a fragmentary, cross-sectional view of the silicon wafer of FIG. 3 undergoing a low energy silicon implant according to the present invention.
Figure 5:
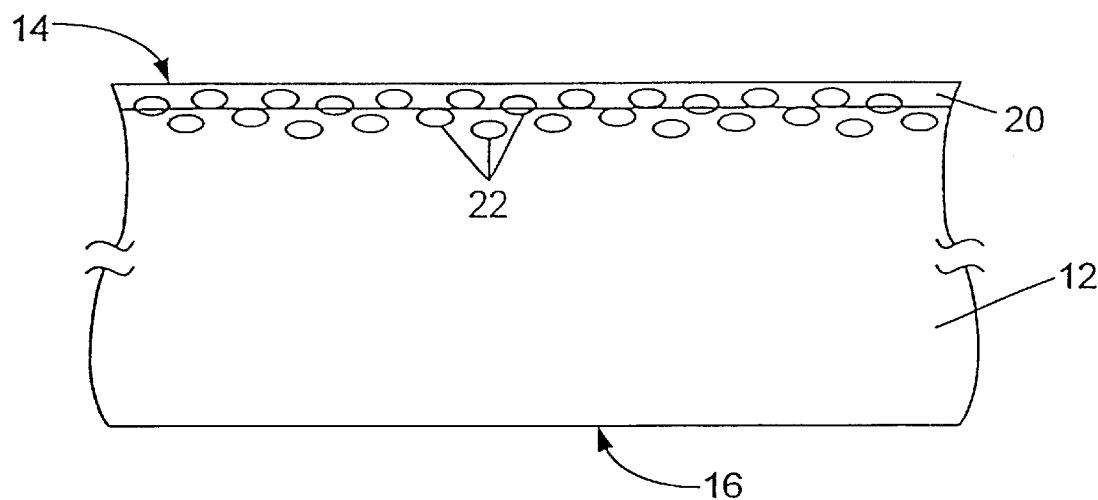
FIG. 5 is a fragmentary, cross-sectional view of the silicon wafer of FIG. 4 after the silicon implant is completed, showing the plurality of defects adjacent the surface of the silicon wafer, which will form gettering sites during a subsequent heat treatment.

Plural gettering sites 22 are formed by low energy ion implantation of silicon into front surface 14, followed by a subsequent heat treatment. As depicted in FIGS. 4 and 5, when the silicon ions are implanted into wafer 12, the ions create defects in the crystal lattice. Upon further heat treatment these defects form gettering sites such as dislocation loops. The ion implantation of silicon is carried out before epi layer 18 is grown to avoid damage to epi layer 18 and to reduce the necessary ion energy. Typically, the gettering sites are formed from the defects during the high temperature growth of epi layer 18. During subsequent CMOS processing, these sites getter a variety of impurities disposed within substrate 10 by attracting the impurities away from epi layer 18. Thus, conventional gettering methods including intrinsic gettering, sandblasting, and polysilicon back-seal are unnecessary.

Further, the method of creating gettering sites by low energy ion implantation of silicon into wafer 12 prior to epi growth ensures that the gettering sites will be disposed relatively close to epi layer 18. Therefore, the gettering efficiency will be higher than for conventional gettering methods. In one embodiment, gettering sites 22 extend less than approximately 0.5 $\mu$m beneath front surface 14. Alternatively, gettering sites 22 may extend further beneath front surface 14 as required by the application.

The depth to which gettering sites 22 extend beneath front surface 14 is largely controlled by the ion energy at which the silicon is implanted. However, the necessary ion energy to create gettering sites 22 at a particular depth will vary depending on a variety of factors including the crystal orientation of wafer 12 and the angle of implantation. In one embodiment, the silicon is implanted at an ion energy in the range of approximately 10–200 keV. Alternatively, the ion energy of the silicon implantation may be adjusted to higher or lower energies as required by the application.

The number or density of gettering sites 22 will increase as the amount of silicon implanted into wafer 12 increases. Too light a dose may result in the creation of too few gettering sites to protect the CMOS circuitry from impurity contamination. Conversely, too high a dose may result in excessive damage to the crystal lattice of wafer 12. In one embodiment, the silicon is implanted at a dose in the range of approximately $10^{13}$–$10^{16}$ cm$^{-2}$. However, other doses may be used as required by the application.

Figure 6:
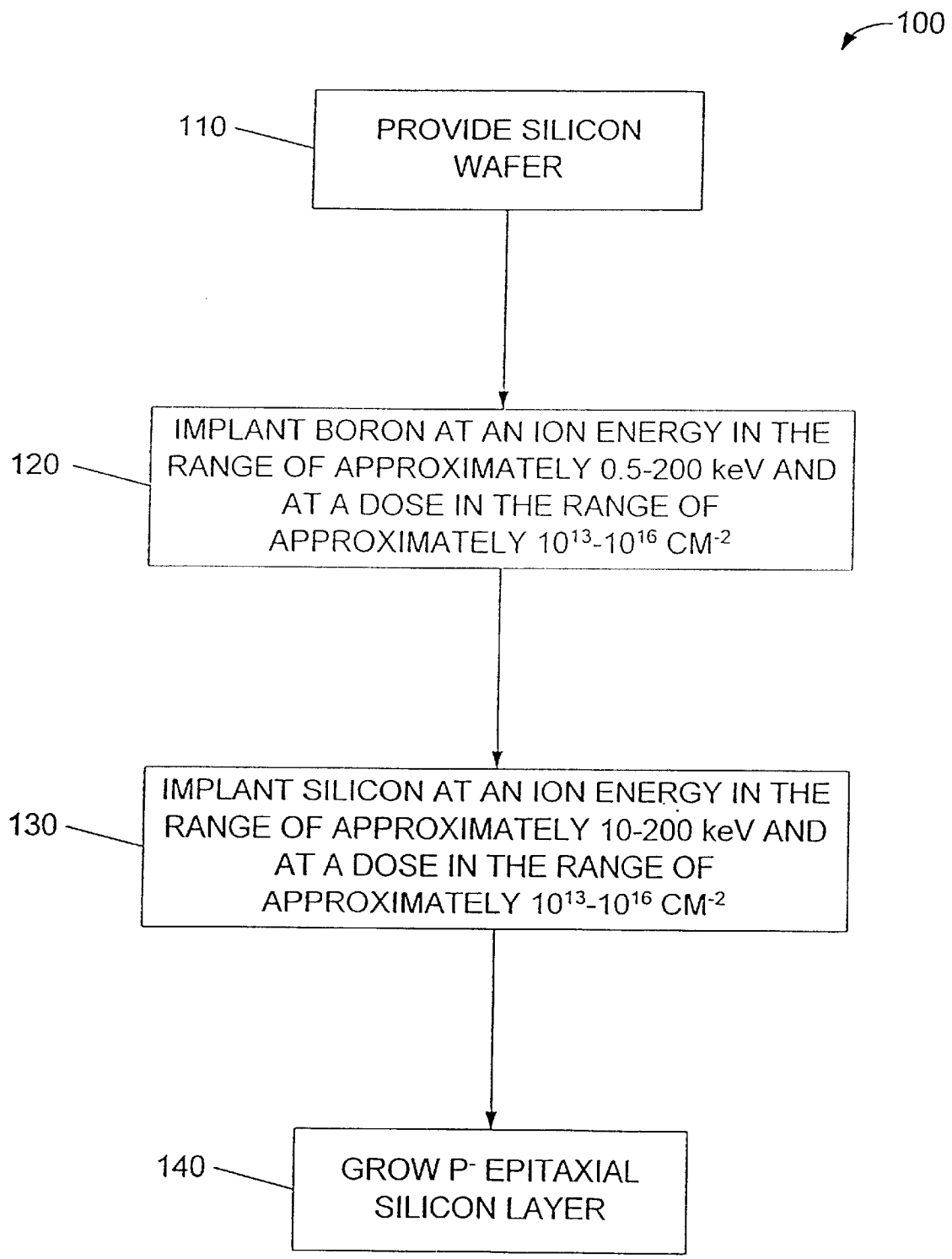
FIG. 6 is a flowchart illustrating a method by which the silicon substrate of FIG. 1 is manufactured.

As described above and indicated generally at 100 in FIG. 6, the invention provides a low cost method of processing silicon wafers to provide substrates with impurity gettering and latch up protection. The invention involves, at step 110, providing a silicon wafer 12 having a front surface 14 and being compatible with standard CMOS processing. Silicon wafer 12 may be n-type or p-type and may be either lightly or heavily doped.

Subsequently at step 120, a selected acceptor ion is implanted into front front surface 14. Typically, the selected acceptor ion is boron. The boron is typically implanted at an ion energy in the range of approximately 5–200 keV, and at a dose in the range of approximately $10^{13}$–$10^{16}$ cm$^{-2}$. Alternatively, a different acceptor ion may be implanted and/or different implantation parameters may be used.

At step 130, a plurality of gettering sites 22 are then created closely adjacent front surface 14 by a relatively low ion energy implantation of silicon into front surface 14, followed by a subsequent heat treatment. The silicon is typically implanted at an ion energy in the range of approximately 10–200 keV, and at a dose in the range of approximately $10^{13}$–$10^{16}$ cm$^{-2}$. Alternatively, different implantation parameters may be used.

While the acceptor implantation of step 120 is depicted and described as occurring before the silicon implantation of step 130, it will be appreciated that the sequence of the steps may be reversed. Moreover, in one embodiment both the acceptor ions and silicon ions are implanted into front surface 14 during a single ion implantation step. In such an embodiment, either the silicon or acceptor ions are implanted first, and then the other ions are implanted without breaking vacuum or removing wafer 12 from the ion implanter. This embodiment achieves the most savings in manufacturing costs since both impurity gettering and latch up protection are accomplished in a single process step. Alternatively, the acceptor and silicon implants may be carried out in separate steps using one or more ion implanters.

In any event, an epitaxial layer 18 is then grown on front surface 14, as indicated at step 140. The thickness and resistivity of epi layer 18 may be adjusted as required by the particular CMOS process. In one embodiment, epi layer 18 is a p$^-$ epi layer. Alternatively, epi layer 18 may be a p$^+$ epi layer, an n$^-$ epi layer, or an n$^+$ epi layer.

It will be appreciated that performing the epi growth step after completion of the acceptor and silicon implantation steps offers several advantages over a reverse sequence. For example, if epi layer 18 were grown first, the implantation steps would require very high ion energies (i.e., 1 MeV or higher) to penetrate epi layer 18 and reach wafer 12. Such high energy implants are more expensive than low energy implants, thus increasing the cost of production. In addition, the damage caused to epi layer 18 by the implants would render the epi layer unusable for many CMOS processes. The method described above ensures that epi layer 18 is free of damage due to ion implantation.

In addition to growing epi layer 18, the acceptor ions implanted at step 120 may be activated during step 140. Further, the defects caused by the silicon implantation at step 130 may be heat treated to form gettering sites during step 140. Alternatively, the acceptor ions may be activated, and/or the defects may be heat treated, during a prior or subsequent anneal step. In any event, once epi layer 18 has been grown, substrate 10 is typically ready for fabrication of CMOS circuitry.

In an alternative embodiment, either the silicon ion implantation or the boron ion implantation is eliminated. For example, for substrates intended for use in bipolar circuitry fabrication, p$^+$ region 20 may be unnecessary since bipolar transistors are not susceptible to CMOS latch up. Thus, step 120 may be eliminated. However, the silicon implantation of step 130 remains effective to provide impurity gettering. Alternatively, some CMOS manufacturers who require substrates with latch up protection, do not need the impurity gettering provided by the silicon implantation. Indeed, the boron implantation itself may provide gettering for some impurities. Thus, step 130 may be eliminated.

It will be appreciated that the above-described process provides a low cost alternative to conventional methods of manufacturing silicon wafers for CMOS processing. The formation of p$^+$ region 20 just beneath epi layer 18 provides latch up protection, thus allowing manufacturers to use less expensive p$^-$ wafers rather than p$^+$ wafers. The method also eliminates the additional processing step of depositing silicon dioxide on back surface 16 because the autodoping effect is substantially reduced or eliminated with the use of p$^-$ wafers. Furthermore, the low ion energy implant needed to form p$^+$ region 20 is less expensive than these conventional methods to prevent latch up.

In addition to latch up protection, the formation of gettering sites 22 just below epi layer 18 provides efficient impurity gettering adjacent the CMOS circuitry, thus eliminating the need for conventional gettering techniques. Not only is the silicon ion implantation method more effective than conventional methods such as intrinsic gettering, back-surface sandblasting, or polysilicon back-seal, it is also less expensive because it can be achieved using low ion energies.

Another advantage of the invention is the reduction of oxygen diffused into epi layer 18 from wafer 12. The gettering sites created by the silicon implantation trap oxygen which is incorporated into the crystal lattice of wafer 12 during crystal growth. As a result, there is less oxygen diffusion from wafer 12 into epi layer 18 and the transition width is minimized. A thinner transition width allows epi layer 18 to be thinner, thus reducing cost and improving circuit performance.

Industrial Applicability

This invention is applicable to semiconductor substrates for electronic circuits, and is particularly applicable to silicon wafers for fabricating CMOS circuitry.

While the invention has been disclosed in its preferred form, the specific embodiments thereof as disclosed and illustrated herein are not to be considered in a limiting sense as numerous variations are possible. Applicants regard the subject matter of their invention to include all novel and non-obvious combinations and subcombinations of the various elements, features, functions and/or properties disclosed herein. No single feature, fiction, element or property of the disclosed embodiments is essential. The following claims define certain combinations and subcombinations which are regarded as novel and non-obvious. Other combinations and subcombinations of features, functions, elements and/or properties may be claimed through amendment of the present claims or presentation of new claims in this or a related application. Such claims, whether they are broader, narrower or equal in scope to the original claims, are also regarded as included within the subject matter of applicants' invention.

We claim:

1. A method of processing a silicon wafer to improve impurity gettering characteristics and reduce CMOS latch up, the method comprising:

providing a silicon wafer having a front surface;

implanting ions of a selected acceptor dopant into the front surface to form a $p^+$ region in the wafer adjacent the front surface;

implanting silicon ions into the front surface to form a plurality of impurity gettering sites in the wafer adjacent the front surface; and then growing a $p^-$ epitaxial layer of silicon on the front surface, the epitaxial layer being configured for fabrication of CMOS circuitry.

2. The method of claim 1, wherein the wafer is a $p^-$ wafer.

3. The method of claim 1, wherein the selected acceptor dopant is boron.

4. The method of claim 3, wherein the $p^+$ region extends less than approximately 0.5 $\mu$m beneath the front surface.

5. The method of claim 3, wherein the $p^+$ region extends approximately 0.1 $\mu$m beneath the front surface.

6. The method of claim 3, wherein the boron is implanted at an ion energy in the range of approximately 5–200 keV.

7. The method of claim 6, wherein the boron is implanted at a dose in the range of approximately $10^{13}$–$10^{16}$ cm$^{-2}$.

8. The method of claim 3, wherein the boron ions and silicon ions are implanted into the wafer during a single ion implantation step.

9. The method of claim 1, wherein the plurality of impurity gettering sites are disposed less than approximately 0.5 $\mu$m beneath the front surface.

10. The method of claim 9, wherein the silicon is implanted at an ion energy in the range of approximately 10–200 keV.

11. The method of claim 10, wherein the silicon is implanted at a dose in the range of approximately $10^{13}$–$10^{16}$ cm$^{-2}$.

12. A semiconductor wafer manufactured according to the method of claim 1.

13. A semiconductor substrate configured for CMOS circuitry fabrication, the substrate comprising:

a silicon wafer having a front surface, the silicon wafer including
      a $p^+$ region adjacent the front surface, and
      a plurality of gettering sites adjacent the front surface; and an epitaxial silicon layer covering the front surface, the epitaxial silicon layer being free of damage due to ion implantation.

14. The semiconductor substrate of claim 13, wherein the epitaxial layer is a $p^-$ epitaxial layer.

15. The semiconductor substrate of claim 14, wherein the $p^+$ region is doped with boron.

16. The semiconductor substrate of claim 15, wherein the $p^+$ region extends less than approximately 0.5 $\mu$m beneath the front surface.

17. The semiconductor substrate of claim 15, wherein the $p^+$ region extends approximately 0.1 $\mu$m beneath the front surface.

18. The semiconductor substrate of claim 14, wherein the plurality of impurity gettering sites are disposed less than approximately 0.5 $\mu$m beneath the front surface.

19. The semiconductor substrate of claim 14, wherein the plurality of gettering sites includes a plurality of dislocation loops.

* * * * *